United States Patent
Chen et al.

(10) Patent No.: US 7,425,486 B2
(45) Date of Patent: Sep. 16, 2008

(54) METHOD FOR FORMING A TRENCH CAPACITOR

(75) Inventors: Chao-Chi Chen, Tainan (TW); Chuan-Ping Hou, Yong Kong (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 409 days.

(21) Appl. No.: 11/285,449

(22) Filed: Nov. 21, 2005

(65) Prior Publication Data

US 2007/0117337 A1     May 24, 2007

(51) Int. Cl.
*H01L 21/8242*   (2006.01)
*H01L 21/20*     (2006.01)
*H01L 21/30*     (2006.01)

(52) U.S. Cl. .................. 438/243; 438/248; 438/386; 438/430; 257/E21.396; 257/E21.628

(58) Field of Classification Search .................. 438/244, 438/386, 424, 435, 248
See application file for complete search history.

(56) References Cited

U.S. PATENT DOCUMENTS

| 6,326,275 | B1 * | 12/2001 | Harrington et al. | 438/386 |
| 6,465,351 | B1 * | 10/2002 | Jeong | 438/689 |
| 6,495,411 | B1 * | 12/2002 | Mei | 438/239 |
| 7,250,336 | B2 * | 7/2007 | Regul et al. | 438/243 |
| 2005/0280007 | A1 * | 12/2005 | Hsu et al. | 257/79 |
| 2006/0060909 | A1 * | 3/2006 | Chi et al. | 257/310 |

* cited by examiner

*Primary Examiner*—Bradley W. Baumeister
*Assistant Examiner*—Julia Slutsker
(74) *Attorney, Agent, or Firm*—K & L Gates LLP

(57) ABSTRACT

A method for forming a trench capacitor is presented in the following process steps. A trench is formed on a semiconductor substrate. A first trench dielectric is deposited into the trench without reaching a full height thereof. An etch stop layer is formed on the first trench dielectric and along inner surfaces of the trench. A second trench dielectric is deposited on the etch stop layer. The second trench dielectric and the etch stop layer are removed to expose the first trench dielectric in the trench. A conductive layer is formed on the first trench dielectric in the trench, such that the conductive layer, the first trench dielectric and the semiconductor substrate function as a trench capacitor.

20 Claims, 6 Drawing Sheets

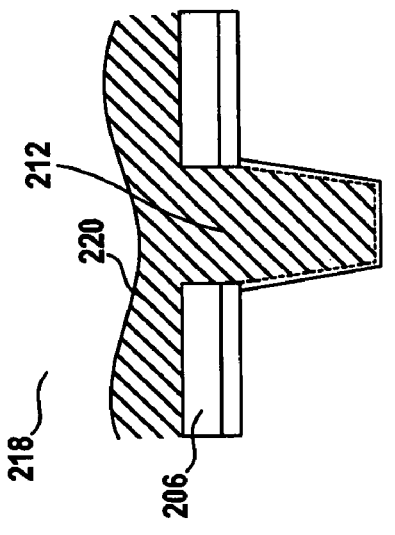
FIG. 2A (PRIOR ART)
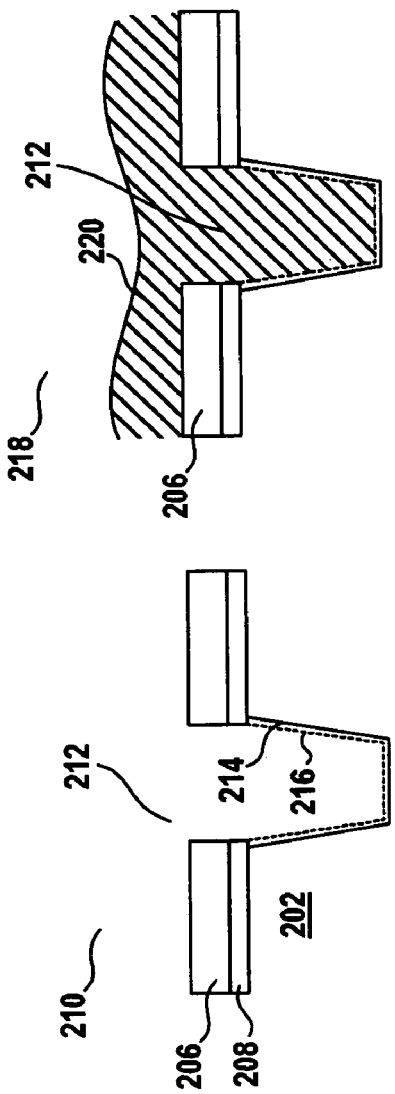
FIG. 2B (PRIOR ART)
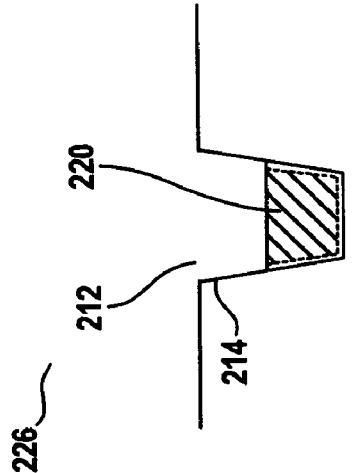
FIG. 2C (PRIOR ART)
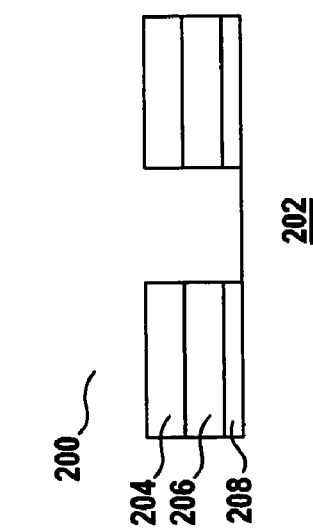
FIG. 2D (PRIOR ART)
FIG. 2E (PRIOR ART)
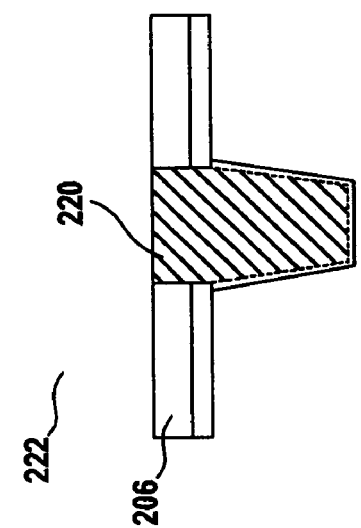
FIG. 2F (PRIOR ART)

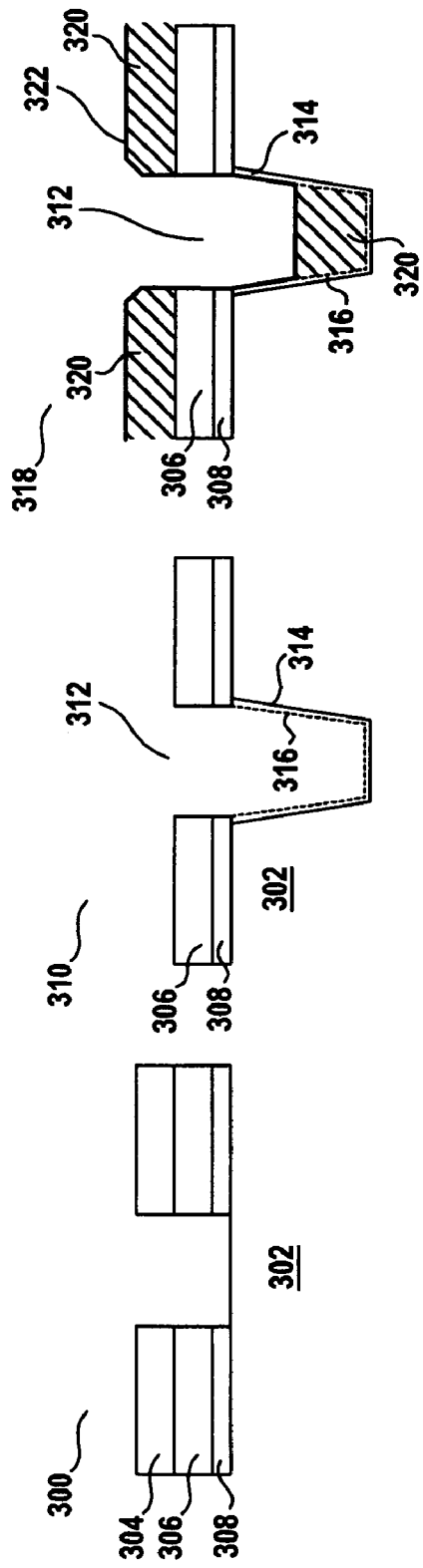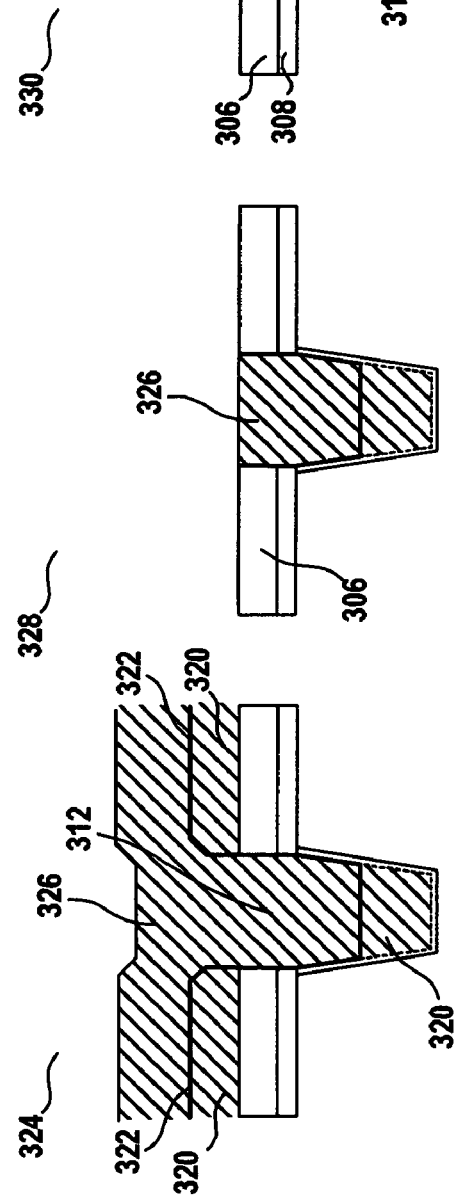

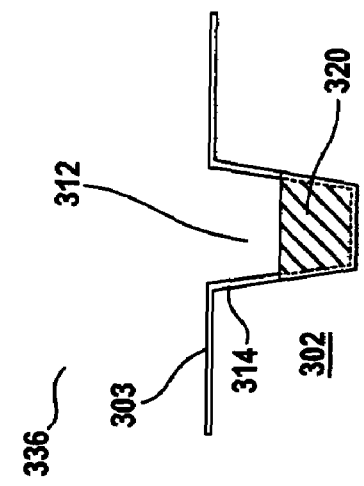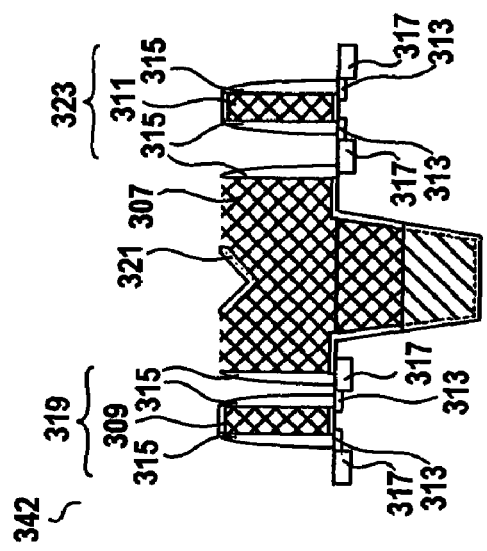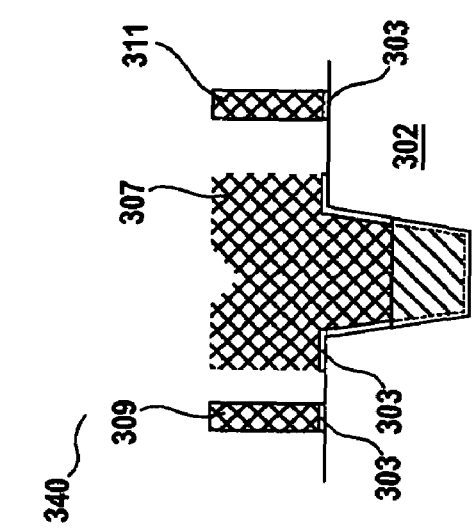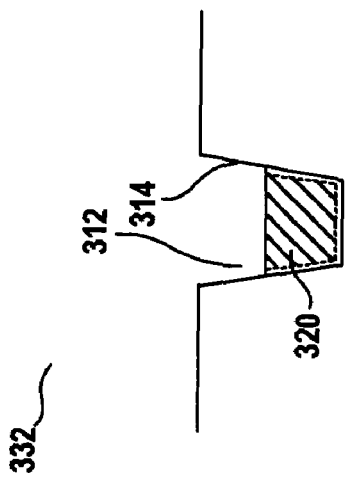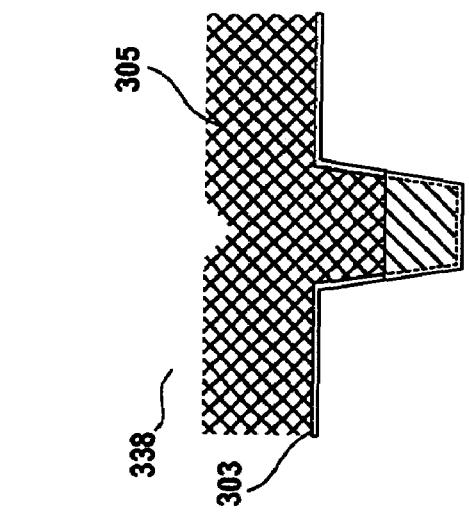

METHOD FOR FORMING A TRENCH CAPACITOR

BACKGROUND

The present invention relates generally to semiconductor processing technology, and more particularly to a method for fabricating a trench capacitor.

An isolation structure is a basic structure for separating transistors and other circuit elements on an integrated circuit (IC). Shallow trench isolation (STI) and local oxidation of silicon (LOCOS) are two typical isolation structures used in ICs. An STI is formed by filling dielectric materials into a trench adjacent to a circuit element, such as a MOS transistor. A LOCOS is formed by selectively oxidizing a predetermined location in the IC. As the ICs continue to scale down, the STI becomes more popular than LOCOS, since the STI occupies less space than LOCOS, and offers better isolation performance.

Capacitors are common circuit elements in an IC. While capacitors may be conveniently constructed anywhere in the IC, there are specific locations where they can be constructed efficiently. For example, it is desirable to construct them on certain locations in order to avoid parasitic reactance. In addition, since it is costly to design new processes only for the purpose of capacitor fabrication, it is also desirable to produce them, using the processes and materials that are already involved in the fabrication of other devices in the IC.

It is therefore advantageous to construct capacitors in STI trenches that are close to one or more devices. For example, a dynamic random access memory (DRAM) cell typically involves a capacitor constructed close to a MOS transistor. While conventional methods provide techniques for constructing a capacitor in an STI trench, there are issues pertaining thereto. Specifically, conventional methods for constructing capacitors in STI trenches yield capacitors that have damaged silicon surfaces adjacent to the capacitor dielectric material. This may cause leakage current, thereby compromising the circuit performance.

Therefore, desirable in the art of semiconductor processing technology are methods for forming high quality capacitors in the STI trenches.

SUMMARY

The present invention discloses a method for forming a trench capacitor. In one embodiment of the invention, the method is presented in the following process steps. A trench is formed on a semiconductor substrate. A first trench dielectric is deposited into the trench without reaching a full height thereof. An etch stop layer is formed on the first trench dielectric and along inner surfaces of the trench. A second trench dielectric is deposited on the etch stop layer. The second trench dielectric and the etch stop layer are removed to expose the first trench dielectric in the trench. A conductive layer is formed on the first trench dielectric in the trench, such that the conductive layer, the first trench dielectric and the semiconductor substrate function as a trench capacitor.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2A-2F illustrate cross sections of a semiconductor structure in various stages during a conventional process for constructing an STI structure.

FIGS. 3A-3L illustrate cross sections of a semiconductor structure in various stages during a process for constructing a trench capacitor in accordance with one embodiment of the present invention.

DESCRIPTION

The following provides a detailed description of a method for preparing a trench capacitor used in a one-transistor DRAM cell. It is however noted that the trench capacitor can be used together with devices other than a DRAM cell.

Figure 1:
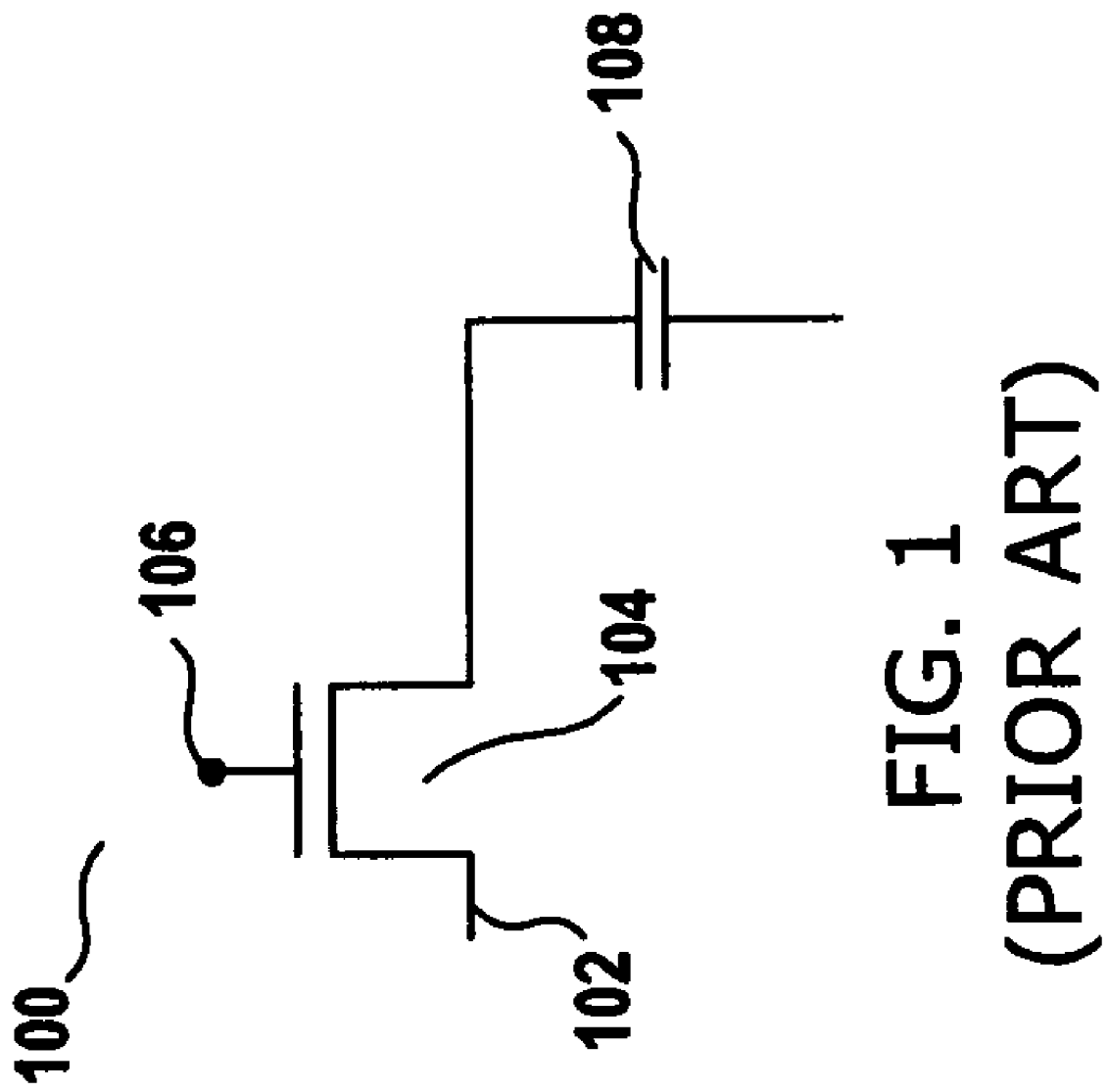
FIG. 1 is a circuit diagram of a one-transistor DRAM cell.

In FIG. 1, a circuit diagram 100 illustrates a one-transistor DRAM cell. The cell is accessed from a bit line 102, through a transistor 104 that is switched by a word line 106. A signal from the bit line 102 is stored in a capacitor 108 as a measured charge. This charge stored in the capacitor 108 lasts for a short time, after which, it must be read, and then rewritten back into the same capacitor as a refreshed data bit.

FIGS. 2A-2F illustrate cross sections of a semiconductor structure in various stages during a conventional process for constructing an STI structure in preparation for construction of a capacitor later on. In FIG. 2A, a cross section 200 shows a semiconductor substrate 202 with a photoresist layer 204 that has been patterned, a silicon nitride hard mask 206 that has been etched, and a pad oxide 208 that has been etched. The semiconductor substrate 202 is ready to be etched anisotropically.

In FIG. 2B, a cross section 210 illustrates a semiconductor structure, in which a trench 212 and a lining oxide 216 are formed. During the processes of forming such semiconductor structure, the photoresist layer 204 (shown in FIG. 2A) is firstly removed. An anisotropic etching process is performed using the silicon nitride hard mask 206 as a shield to form the trench 212 in the semiconductor substrate 202. Since the etchant gas used by the anisotropic etching process is specific to silicon, no substantial damage would occur to the silicon nitride hard mask 206 and the pad oxide 208. The exposed semiconductor surface 214 within the trench 212 is then covered by a lining oxide 216.

In FIG. 2C, a cross section 218 illustrates a semiconductor structure, in which a trench oxide 220 is deposited to fill the trench 212, and covers the silicon nitride hard mask 206. In FIG. 2D, a cross section 222 illustrates a semiconductor structure, in which trench oxide 220 has been planarized by technologies, such as overflow-dump-rinse (ODR) etching or chemical mechanical polish (CMP).

In FIG. 2E, a cross section 224 illustrates a semiconductor structure, in which the trench oxide 220 and the lining oxide 216 have been further etched. A portion of the trench oxide 220 remains in the trench 212. In FIG. 2F, a cross section 226 illustrates a semiconductor structure, in which the silicon nitride hard mask 206 and pad oxide 208, shown in 2E, are removed. This prepares the trench 212 for a further construction of a capacitor thereon.

During the process of etching the planarized trench oxide 220 (shown in FIG. 2D), a time mode etching control scheme is used, meaning that the etching process is stop when a certain period of time has run. Due to process variation of the etching, the time mode etching control scheme may not provide the remaining trench oxides 220 (shown in FIG. 2E) with a consistent thickness. Moreover, the etching process may cause damage to the exposed semiconductor surface 214. As a result, the conventional method may cause leakage current or other reliability issues to the capacitor that will be constructed on the trench oxide 220.

FIGS. 3A-3L illustrate cross sections of a semiconductor structure in various stages during a process for constructing a trench capacitor in accordance with one embodiment of the present invention. In FIG. 3A, a cross section 300 shows a semiconductor substrate 302 with a photoresist layer 304 that has been patterned and the first and second dielectric layers 308 and 306 that have been etched. The semiconductor substrate 302 is ready to be etched anisotropically. It is understood that the first and second dielectric layers 308 and 306 can be any dielectric materials, such as silicon oxide, silicon nitride, silicon oxynitride, etc. In this embodiment, the first dielectric layer 308 can be a pad oxide layer, and the second dielectric layer 306 can be a silicon nitride hard mask.

In FIG. 3B, a cross section 310 illustrates a semiconductor structure, in which a trench 312 and a lining dielectric layer 316 are formed. During the processes of forming such semiconductor structure, the photoresist layer 304 (shown in FIG. 3A) is firstly removed. An anisotropic etching process is performed using the second dielectric layer 306 as a shield to form the trench 312 in the semiconductor substrate 302. Since the etchant gas used by the anisotropic etching process is specific to silicon, no substantial damage would occur to the first and second dielectric layers 308 and 306. The exposed semiconductor surface 314 within the trench 312 is then covered by a lining dielectric layer 316.

In FIG. 3C, a cross section 318 illustrates a semiconductor structure, in which a first trench dielectric 320 and an etch stop layer 322 are formed. During the process of the forming such semiconductor structure, the first trench dielectric 320 is deposited on the second dielectric layer 306 and partially fills the trench 312. The deposition is carried out by technology, such as high-density plasma chemical vapor deposition (HDPCVD), wherein the adjustment of its process parameters can balance deposition and sputter etch rates in order to avoid forming voids in the first trench dielectric 320. The depth of the first trench dielectric 320 depends on various circuit designs. In this embodiment, the dielectric-fill progresses up to leaving a depth of about 3,000 Å for the first trench dielectric 320. An etch stop layer 322 (shown in the bold line) is deposited along inner surfaces of the trench 312. This etch stop layer 322 covers the first trench dielectric 320, the lining dielectric layer 316, and the sidewalls of the first and second dielectric layers 308 and 306 in the trench 312. The etch stop layer 322 will protect the lining dielectric layer 316 and the otherwise exposed semiconductor surface 314 from an etching process that will follow. It is noted that the etch stop layer 322 and the first trench dielectric 320 can be made substantially of any dielectric materials. In this embodiment, the etch stop layer 322 and the first trench dielectric 320 can be made substantially of silicon nitride and silicon oxide, respectively.

In FIG. 3D, a cross section 324 illustrates a semiconductor structure, in which a second trench dielectric 326 is deposited on the etch stop layer 322 and fills the space inside the trench 312. This second trench dielectric 326 deposition can be carried out by HDPCVD. Again, the adjustment of process parameters can balance deposition and sputter etch rates in order to avoid the formation of voids in the second trench dielectric 326.

In FIG. 3E, a cross section 328 illustrates a semiconductor substrate, in which the second trench dielectric 326 has been planarized by technologies such as reverse-pattern ODR etching and CMP. In FIG. 3F, a cross section 330 illustrates a semiconductor structure, in which the second trench dielectric 326, shown earlier in FIG. 3E, has been etched down to the etch stop layer 322. The first trench dielectric 320 fills the remaining depth of the trench 312 below the etch stop layer 322. An etchant gas that is specific to removing the second trench dielectric 326 has been used. This etchant gas barely etches the etch stop layer 322. The etch is controlled by end-point-mode, which means that the etching process is analyzed in real time and the process is ended when the second trench dielectric 326 has been etched away and the etch stop layer 322 has been fully exposed. This mode of process control is more precise and material, responsive than the conventional simple time-mode etching. Thus, the depth of the first trench dielectric 320 can be well controlled, and the surface 314 of the semiconductor substrate 302 can be well protected from damage during the etching process.

In FIG. 3G, a cross section 332 illustrates the remaining semiconductor structure after the second dielectric layer 306, the first dielectric layer 308, and the etch stop layer 322, all shown in FIG. 3F, have been removed. The first trench dielectric 320 remains in the trench 312.

To completely form a trench capacitor for a DRAM cell, the process steps for forming the same are explained by referring to a series of cross sections of the semiconductor structure shown in FIGS. 3H-3L. In FIG. 3H, a cross section 334 illustrates a semiconductor structure, in which a sacrificial oxide 301 is grown on the surface of the semiconductor substrate 302 that was exposed by the first trench dielectric 320 remaining in the trench 312. The growth of the sacrificial oxide 301 consumes surface contaminants and minor surface defects, such as crystal defects and implant damage. The sacrificial oxide 301 is then etched away in order to provide a fresh surface for the construction of critical structures to follow.

In FIG. 3I, a cross section 336 illustrates a semiconductor structure 336, in which a gate dielectric layer 303 is formed on the surface of the semiconductor substrate 302 that had been covered by the first dielectric layer 308 (shown in FIG. 3B), and also on its surface 314 exposed by the first trench dielectric 320 that remains in the trench 312.

In FIG. 3J, a cross section 338 illustrates a semiconductor structure, in which a polycrystalline silicon(poly) layer 305 is deposited on the gate dielectric layer 303. In FIG. 3K, a cross section 340 illustrates a semiconductor structure, in which the poly-silicon layer 305 and the gate dielectric layer 303 are patterned to form an upper capacitor electrode 307, and MOS gates 309 and 311. The gate dielectric layer 303 also forms the capacitor dielectric under the upper capacitor electrode 307. The lower capacitor electrode is the semiconductor substrate 302.

In FIG. 3L, a cross section 342 illustrates a semiconductor structure, in which a functional memory cell is constructed from the semiconductor structure shown in FIG. 3K. Low-doped drains 313 are implanted. Sidewall spacers 315 are formed on the sides of the upper capacitor electrode 307, and the MOS gates 309 and 311. The sources/drains 317 are implanted. Metal silicide is formed on the exposed silicon portions of the sources/drains 317 of MOS transistors 319 and 323, and the upper capacitor electrode 307. The MOS transistor 319 and the capacitor 321 form a one-transistor DRAM cell.

As discussed above, the proposed method can protect the semiconductor adjacent to the trench from being damaged during the construction of the trench capacitor. Furthermore, it can well control the thickness of the remaining trench dielectric in the trench. As a result, the current leakage of the trench capacitor constructed by the proposed method is improved.

Figure 4:
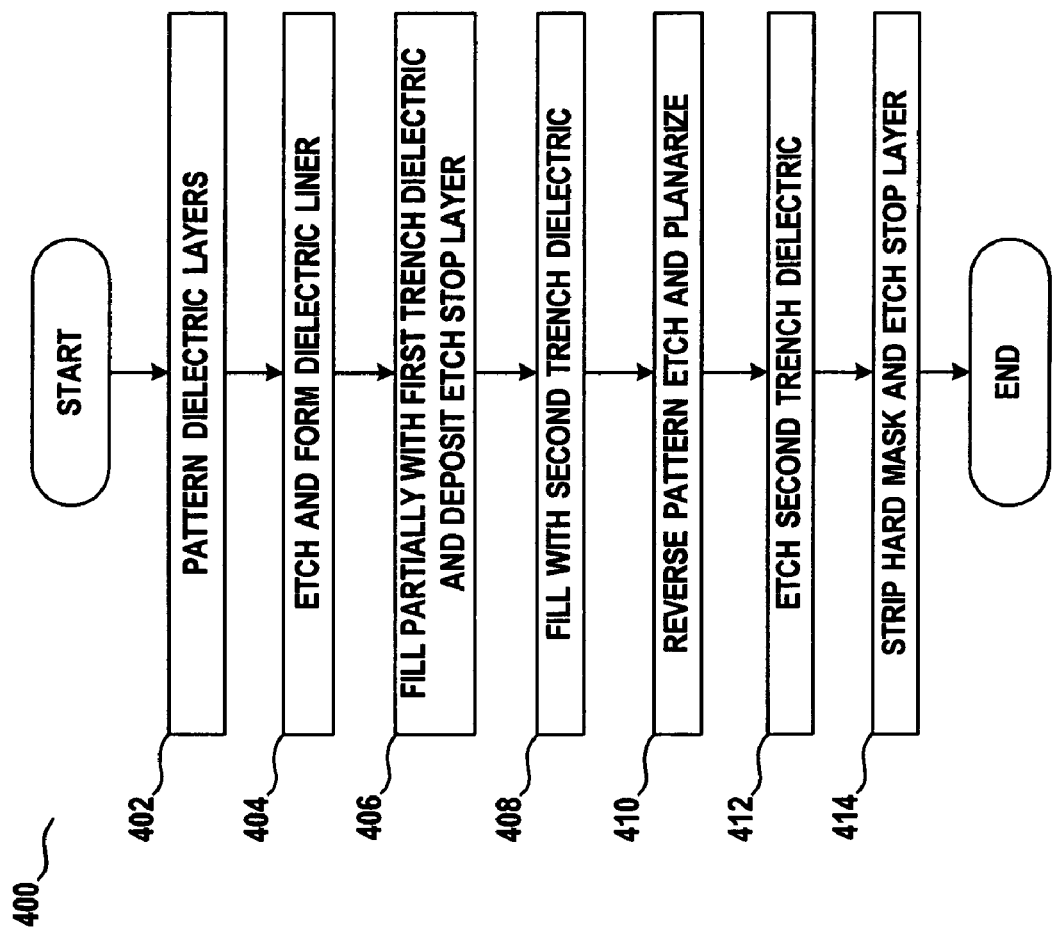
FIG. 4 is a process flow for preparing an STI structure in accordance with one embodiment of the present invention.

FIG. 4 presents a process flow 400 for preparing a trench for the further construction of the trench capacitor in accordance with one embodiment of the present invention. In step 402, a photoresist layer is patterned and first and second dielectric layers are etched, as shown in FIG. 3A. In step 404, a trench is etched anisotropically and a dielectric liner is formed, as shown in FIG. 3B. In step 406, the trench is partially filled with the first trench dielectric and an etch stop layer is deposited, as shown in FIG. 3C. In step 408, the remaining trench is filled with the second trench dielectric, as shown in FIG. 3D. In step 410, the second trench dielectric is planarized down to the second dielectric layer, as shown in FIG. 3E. In step 412, the second trench dielectric is etched down to the etch stop layer in the trench, as shown in FIG. 3F. In step 414, the second dielectric, the etch stop layer, and the first dielectric are removed, as shown in FIG. 3G.

Figure 5:
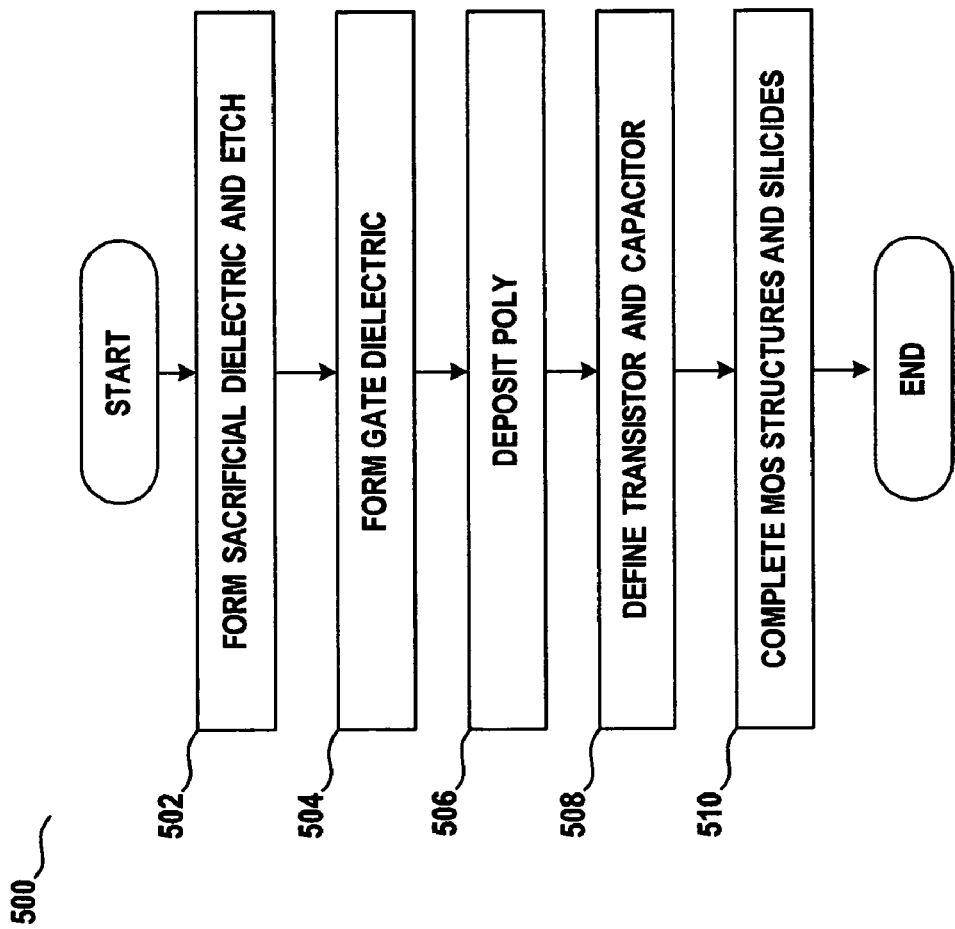
FIG. 5 is a process flow for preparing a trench capacitor based on the STI structure in accordance with another embodiment of the present invention.

FIG. 5 is a flow 500 for forming a trench capacitor on the trench in accordance with one embodiment of the present invention. In step 502, a sacrificial oxide is formed inside the trench walls, as shown in FIG. 3H, and then etched away. In step 504, a gate dielectric layer is formed inside the trench walls, as shown in FIG. 3I. In step 506, a poly-silicon layer is deposited, as shown in FIG. 3J. In step 508, transistor gate and capacitor patterns are defined in the poly-silicon layer, as shown in FIG. 3K. In step 510, MOS transistor structures and capacitor with silicides are completed, as shown in FIG. 3L.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming a trench capacitor, comprising:
   forming a trench in a semiconductor substrate;
   depositing a first trench dielectric into the trench for partially filling the trench in the semiconductor substrate;
   forming an etch stop layer on the trench partially filled with the first trench dielectric and along inner surfaces of the trench;
   depositing a second trench dielectric on the etch stop layer to fill the trench;
   removing the second trench dielectric and the etch stop layer to expose the first trench dielectric on the trench; and
   forming a conductive layer on the first trench dielectric in the trench, such that the conductive layer, the first trench dielectric and the semiconductor substrate function as a trench capacitor, wherein the second trench dielectric remaining on the etch stop layer in the trench is etched down to the etch stop layer by an end-point-mode etching.

2. The method of claim 1 wherein the first and second trench dielectrics are made substantially of silicon oxide.

3. The method of claim 2 wherein the first and second trench dielectrics are deposited by using high density plasma chemical vapor deposition (HEPCVD) technology.

4. The method of claim 3 wherein the etch stop layer is made substantially of silicon nitride.

5. The method of claim 4 wherein the step of removing comprises initially removing the second trench dielectric deposited outside the trench.

6. The method of claim 5 wherein the step of initially removing is performed by using chemical mechanical polish (CMP) technology.

7. The method of claim 5 wherein the step of removing comprises further removing the second trench dielectric remaining on the etch stop layer in the trench.

8. The method of claim 7 wherein the step of removing further comprises completely removing the etch stop layer in the trench.

9. The method of claim 8, before the step of forming the conductive layer, further comprising forming a sacrificial layer on the semiconductor substrate uncovered by the first trench dielectric in the trench.

10. The method of claim 9 further comprising removing the sacrificial layer.

11. The method of claim 10, before the step of forming the conductive layer, farther comprising forming a gate dielectric layer along inner surfaces of trench.

12. A method for forming a trench capacitor for a memory cell, comprising:
    forming a trench in a semiconductor substrate;
    depositing a first trench dielectric on the trench in the semiconductor substrate and partially filling the trench;
    forming an etch stop layer on the trench partially filled with the first trench dielectric and along inner surfaces of the trench;
    depositing a second trench dielectric on the etch stop layer to fill the trench;
    removing the second trench dielectric, the etch stop layer and the first trench dielectric that are disposed outside the trench;
    removing the second trench dielectric remaining on the etch stop layer in the trench by an end-point-mode etching;
    removing the etch stop layer to expose the first trench dielectric in the trench; and
    forming a conductive layer on the first trench dielectric remaining in the trench, such that the conductive layer, the remaining trench dielectric and the semiconductor substrate function as a trench capacitor.

13. The method of claim 12 wherein the first and second trench dielectrics are made substantially of silicon oxide.

14. The method of claim 13 wherein the etch stop is made substantially of silicon nitride.

15. The method of claim 14, before the step of forming the conductive layer, further comprising forming a sacrificial layer on the semiconductor substrate uncovered by the remaining first trench dielectric.

16. The method of claim 15 further comprising removing the sacrificial layer.

17. The method of claim 16, before the step of forming the conductive layer, further comprising forming a gate dielectric layer over the semiconductor substrate.

18. A method for forming a trench capacitor for a dynamic random memory (DRAM) cell, comprising:
    forming a trench in a semiconductor substrate;
    depositing a first trench dielectric on the semiconductor substrate and partially filling the trench;
    forming an etch stop layer on the trench partially filled with the first trench dielectric and along inner surfaces of the trench;

depositing a second trench dielectric on the etch stop layer to fill the trench;

removing the second trench dielectric, the etch stop layer and the first trench dielectric that are disposed outside the trench;

removing the second trench dielectric remaining on the etch stop layer in the trench by an end-point-mode etching;

removing the etch stop layer to expose the first trench dielectric remaining in the trench;

forming a sacrificial layer on the semiconductor substrate uncovered by the remaining first trench dielectric;

removing the sacrificial layer;

forming a gate dielectric layer over the semiconductor substrate; and forming a conductive layer on the first trench dielectric remaining in the trench, such that the conductive layer, the remaining first trench dielectric and the semiconductor substrate function as a trench capacitor.

19. The method of claim 18 wherein the first and second trench dielectrics are made substantially of silicon oxide.

20. The method of claim 19 wherein the etch stop layer is made substantially of silicon nitride.

* * * * *